(12) United States Patent
Schaepkens et al.

(10) Patent No.: US 8,455,041 B2
(45) Date of Patent: Jun. 4, 2013

(54) DIFFUSION BARRIER COATINGS HAVING GRADED COMPOSITIONS AND DEVICES INCORPORATING THE SAME

(75) Inventors: Marc Schaepkens, Ballston Lake, NY (US); Kevin Flanagan, Albany, NY (US)

(73) Assignee: General Electric Company, Niskayuan, NY (US)

( * ) Notice: Subject to any disclaimer, the term of this patent is extended or adjusted under 35 U.S.C. 154(b) by 2193 days.

(21) Appl. No.: 11/188,984

(22) Filed: Jul. 26, 2005

(65) Prior Publication Data

US 2005/0260395 A1 Nov. 24, 2005

Related U.S. Application Data

(62) Division of application No. 10/065,018, filed on Sep. 11, 2002, now Pat. No. 7,015,640.

(51) Int. Cl.
*B05D 5/06* (2006.01)

(52) U.S. Cl.
USPC .............................. 427/66; 313/506; 313/509

(58) Field of Classification Search
None
See application file for complete search history.

(56) References Cited

U.S. PATENT DOCUMENTS

| | | | |
|---|---|---|---|
| 3,932,693 A | 1/1976 | Shaw et al. | |
| 4,540,763 A | 9/1985 | Kirchhoff | |
| 4,552,791 A | 11/1985 | Hahn | |
| 4,842,941 A * | 6/1989 | Devins et al. | 428/412 |
| 5,185,391 A | 2/1993 | Stokich, Jr. | |
| 5,462,779 A | 10/1995 | Misiano et al. | |
| 5,547,714 A * | 8/1996 | Huck et al. | 427/523 |
| 5,643,638 A * | 7/1997 | Otto et al. | 427/569 |
| 5,654,084 A | 8/1997 | Egert | |
| 5,683,757 A | 11/1997 | Iskanderova et al. | |
| 5,736,207 A * | 4/1998 | Walther et al. | 428/34.7 |
| 5,757,126 A | 5/1998 | Harvey, III et al. | |
| 5,998,803 A | 12/1999 | Forrest et al. | |
| 6,023,371 A | 2/2000 | Onitsuka et al. | |
| 6,097,147 A | 8/2000 | Baldo et al. | |
| 6,268,695 B1 * | 7/2001 | Affinito | 313/504 |
| 6,291,116 B1 | 9/2001 | Wolk et al. | |
| 6,395,341 B1 | 5/2002 | Arakawa et al. | |
| 6,413,645 B1 | 7/2002 | Graff et al. | |

(Continued)

FOREIGN PATENT DOCUMENTS

| | | |
|---|---|---|
| EP | 0026973 | 8/1980 |
| EP | 0181648 | 9/1985 |

(Continued)

OTHER PUBLICATIONS

H. Suzuki et al., "Near-Ultraviolet Electroluminescence from Polysilanes," 331 Thin Solid Films 64-70 (1998).

(Continued)

*Primary Examiner* — Joseph Miller, Jr.
(74) *Attorney, Agent, or Firm* — Duane Morris LLP

(57) ABSTRACT

A composite article comprises a substrate having at least a substrate surface and a graded-composition coating disposed on a substrate surface. The composition of the coating material varies substantially continuously across its thickness. The coating reduces the transmission rates of oxygen, water vapor, and other chemical species through the substrate such that the composite article can be used effectively as a diffusion barrier to protect chemically sensitive devices or materials. An organic light-emitting device incorporates such a composite article to provide an extended life thereto.

11 Claims, 11 Drawing Sheets

U.S. PATENT DOCUMENTS

| | | |
|---|---|---|
| 6,522,067 B1 | 2/2003 | Graff et al. |
| 6,576,351 B2 | 6/2003 | Silvernail |
| 6,642,652 B2 | 11/2003 | Collins et al. |
| 6,777,871 B2 | 8/2004 | Duggal et al. |
| 2001/0000331 A1* | 4/2001 | Ram et al. ............... 428/423.1 |
| 2001/0016093 A1* | 8/2001 | Dawes et al. ............... 385/14 |
| 2002/0045361 A1* | 4/2002 | Cheung et al. ............... 438/790 |
| 2002/0136895 A1* | 9/2002 | Kohara et al. ............... 428/408 |
| 2003/0193286 A1* | 10/2003 | Ottermann et al. ............... 313/506 |

FOREIGN PATENT DOCUMENTS

| | | |
|---|---|---|
| EP | 0182336 | 4/2000 |
| JP | 2004098525 A | 4/2004 |
| WO | WO 00/26973 | 5/2000 |
| WO | WO01/81649 A1 | 11/2001 |
| WO | WO 01/82336 A2 | 11/2001 |

OTHER PUBLICATIONS

Gijsbert Jan Meeusen, "Plasma Beam Deposition of Amorphous Hydrogenated Silicon," Thesis, University of Eindhoven, pp. 16-19 (1994).

Bastiaan Arie Korevaar, "Integration of Expanding Thermal Plasma Deposited Hydrogenated Amorphous Silicon in Solar Cells," Thesis, University of Eindhoven, pp. 23-34 (2002).

V.J. Law et al., "RF Probe Technology for the Next Generation of Technological Plasmas," J. Phys. D: Appl. Phys., 34, 2726-33 (2001).

\* cited by examiner

DIFFUSION BARRIER COATINGS HAVING GRADED COMPOSITIONS AND DEVICES INCORPORATING THE SAME

BACKGROUND OF INVENTION

The present invention relates generally to composite films having improved resistance to diffusion of chemical species and to devices incorporating such composite films. In particular, the present invention relates to light-emitting devices having at least an organic electroluminescent material that incorporate such composite films and have improved stability in the environment.

Electroluminescent ("EL") devices, which may be classified as either organic or inorganic, are well known in graphic display and imaging art. EL devices have been produced in different shapes for many applications. Inorganic EL devices, however, typically suffer from a required high activation voltage and low brightness. On the other hand, organic EL devices ("OELDs"), which have been developed more recently, offer the benefits of lower activation voltage and higher brightness in addition to simple manufacture, and, thus, the promise of more widespread applications.

An OELD is typically a thin film structure formed on a substrate such as glass or transparent plastic. A light-emitting layer of an organic EL material and optional adjacent semiconductor layers are sandwiched between a cathode and an anode. The semiconductor layers may be either hole (positive charge)-injecting or electron (negative charge)-injecting layers and also comprise organic materials. The material for the light-emitting layer may be selected from many organic EL materials. The light emitting organic layer may itself consist of multiple sublayers, each comprising a different organic EL material. State-of-the-art organic EL materials can emit electromagnetic ("EM") radiation having narrow ranges of wavelengths in the visible spectrum. Unless specifically stated, the terms "EM radiation" and "light" are used interchangeably in this disclosure to mean generally radiation having wavelengths in the range from ultraviolet ("UV") to mid-infrared ("mid-IR") or, in other words, wavelengths in the range from about 300 nm to about 10 micrometer. To achieve white light, prior-art devices incorporate closely arranged OELDs emitting blue, green, and red light. These colors are mixed to produce white light.

Conventional OELDs are built on glass substrates because of a combination of transparency and low permeability of glass to oxygen and water vapor. A high permeability of these and other reactive species can lead to corrosion or other degradation of the devices. However, glass substrates are not suitable for certain applications in which flexibility is desired. In addition, manufacturing processes involving large glass substrates are inherently slow and, therefore, result in high manufacturing cost. Flexible plastic substrates have been used to build OLEDs. However, these substrates are not impervious to oxygen and water vapor, and, thus, are not suitable per se for the manufacture of long-lasting OELDs. In order to improve the resistance of these substrates to oxygen and water vapor, alternating layers of polymeric and ceramic materials have been applied to a surface of a substrate. It has been suggested that in such multilayer barriers, a polymeric layer acts to mask any defects in an adjacent ceramic layer to reduce the diffusion rates of oxygen and/or water vapor through the channels made possible by the defects in the ceramic layer. However, an interface between a polymeric layer and a ceramic layer is generally weak due to the incompatibility of the adjacent materials, and the layers, thus, are prone to be delaminated.

Therefore, there is a continued need to have robust films that have reduced diffusion rates of environmentally reactive materials. It is also very desirable to provide such films to produce flexible OELDs that are robust against degradation due to environmental elements.

SUMMARY OF INVENTION

The present invention provides a substrate having at least a coating disposed on a surface thereof, which coating is capable of reducing diffusion rates of chemical species therethrough. The coating comprises a material the composition of which varies across a thickness thereof. Such a coating will be termed interchangeably hereinafter a "diffusion-barrier coating having graded composition," "graded-composition diffusion-barrier coating," "graded-composition barrier coating," "diffusion-barrier coating," or simply "graded-composition coating".

In one aspect of the present invention, the substrate comprises a polymeric material.

In another aspect of the present invention, a region between the substrate and the coating is diffuse such that there is a gradual change from the composition of the bulk substrate to the composition of the portion of the coating adjacent to the substrate. In this embodiment, a material of the coating adjacent to the substrate penetrates into the substrate.

In still another aspect of the present invention, at least a substrate having a diffusion-barrier coating having graded composition is included in an assembly comprising a device sensitive to chemical species to protect such an assembly from attack by these chemical species.

In still another aspect of the present invention, such a device is an OELD, which comprises a pair of electrodes and an organic light-emitting layer sandwiched therebetween.

In yet another aspect of the present invention, an OELD is sandwiched between two films, each having a diffusion-barrier coating having graded composition.

The present invention also provides a method for making a substrate coated with a diffusion barrier coating having a graded composition. The method comprises the steps of: (a) providing a substrate having a substrate surface; (b) depositing a coating material having a first composition on the substrate surface; and (c) changing a composition of the coating material substantially continuously such that the composition of the coating varies from the first composition to a second composition across a thickness of the coating.

In another aspect of the present invention, a method for making an assembly comprising a device that is sensitive to chemical species comprises the steps of: (a) providing at least a substrate coated with a diffusion barrier coating having a graded composition; and (b) disposing the device on the substrate.

In another aspect of the present invention, such a device is an OELD, and the method comprises the steps of: (a) providing at least a substrate coated with a diffusion barrier coating having a graded composition; (b) forming a first electrode on the substrate; (c) forming an organic light-emitting layer on the first electrode; and (d) forming a second electrode on the organic light-emitting layer.

In still another aspect of the present invention, an OLED comprising a pair of electrodes and an organic light-emitting layer disposed between the pair of electrodes and a substrate, coated with a diffusion barrier coating having a graded composition are laminated together to form a light source.

Other features and advantages of the present invention will be apparent from a perusal of the following detailed descrip-

DETAILED DESCRIPTION

Figure 1:
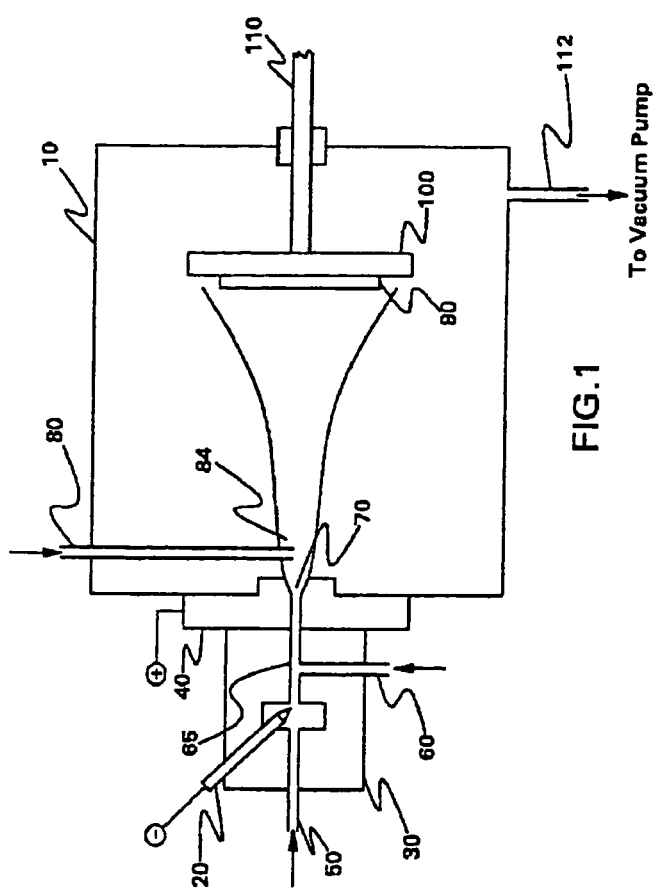
FIG. 1 is a schematic diagram of a deposition apparatus using the expanding thermal-plasma chemical-vapor deposition.

The present invention, in one aspect, provides a substrate having at least a coating disposed on a surface thereof, which coating is capable of reducing diffusion rates of chemical species through the substrate. The coating comprises a material, the composition of which varies across a thickness thereof. Such a coated substrate finds uses in providing protection to many devices or components; e.g., electronic devices, that are susceptible to reactive chemical species normally encountered in the environment. In another example, such a substrate or film having a diffusion-barrier coating having graded composition can advantageously be used in packaging of materials, such as foodstuff, that are easily spoiled by chemical or biological agents normally existing in the environment.

Organic light-emitting material and/or cathode materials in OELDs are susceptible to attack by reactive species existing in the environment, such as oxygen, water vapor, hydrogen sulfide, $SO_x$, $NO_x$, solvents, etc. Films having a graded-composition diffusion-barrier coating are particularly useful to extend the life of these devices and render them more commercially viable. A barrier coating of the present invention may be made by depositing reaction or recombination products of reacting species onto a substrate or film. Varying the relative supply rates or changing the identities of the reacting species results in a coating that has a graded composition across its thickness. Thus, a coating of the present invention does not have distinct interfaces at which the composition of the coating changes abruptly. Such abrupt changes in composition tend to introduce weak spots in the coating structure where delamination can easily occurs. Substrate materials that benefit from having a graded-composition diffusion-barrier coating are organic polymeric materials; such as polyethyleneterephthalate ("PET"); polyacrylates; polycarbonate; silicone; epoxy resins; silicone-functionalized epoxy resins; polyester such as Mylar (made by E.I. du Pont de Nemours & Co.); polyimide such as Kapton H or Kapton E (made by du Pont), Apical AV (made by Kanegafugi Chemical Industry Company), Upilex (made by UBE Industries, Ltd.); polyethersulfones ("PES," made by Sumitomo); polyetherimide such as Ultem (made by General Electric Company); and polyethylenenaphthalene ("PEN").

Suitable coating compositions of regions across the thickness are organic, inorganic, or ceramic materials. These materials are typically reaction or recombination products of reacting plasma species and are deposited onto the substrate surface. Organic coating materials typically comprise carbon, hydrogen, oxygen, and optionally other minor elements, such as sulfur, nitrogen, silicon, etc., depending on the types of reactants. Suitable reactants that result in organic compositions in the coating are straight or branched alkanes, alkenes, alkynes, alcohols, aldehydes, ethers, alkylene oxides, aromatics, etc., having up to 15 carbon atoms. Inorganic and ceramic coating materials typically comprise oxide; nitride; carbide; boride; or combinations thereof of elements of Groups IIA, IIIA, IVA, VA, VIA, VIIA, IB, and IIB; metals of Groups IIIB, IVB, and VB; and rare-earth metals. For example, silicon carbide can be deposited onto a substrate by recombination of plasmas generated from silane ($SiH_4$) and an organic material, such as methane or xylene. Silicon oxycarbide can be deposited from plasmas generated from silane, methane, and oxygen or silane and propylene oxide. Silicon oxycarbide also can be deposited from plasmas generated from organosilicone precursors, such as tetraethoxysilane (TEOS), hexamethyldisiloxane (HMDSO), hexamethyldisilazane (HMDSN), or octamethylcyclotetrasiloxane (D4). Silicon nitride can be deposited from plasmas generated from silane and ammonia. Aluminum oxycarbonitride can be deposited from a plasma generated from a mixture of aluminum tartrate and ammonia. Other combinations of reactants may be chosen to obtain a desired coating composition. The choice of the particular reactants is within the skills of the artisans. A graded composition of the coating is obtained by changing the compositions of the reactants fed into the reactor chamber during the deposition of reaction products to form the coating.

Coating thickness is typically in the range from about 10 nm to about 10000 nm, preferably from about 10 nm to about 1000 nm, and more preferably from about 10 nm to about 200 nm. It may be desired to choose a coating thickness that does not impede the transmission of light through the substrate, such as a reduction in light a transmission being less than about 20 percent, preferably less than about 10 percent, and more preferably less than about 5 percent. The coating may be formed by one of many deposition techniques, such as plasma-enhanced chemical-vapor deposition ("PECVD"), radio-frequency plasma-enhanced chemical-vapor deposition ("RFPECVD"), expanding thermal-plasma chemical-vapor deposition ("ETPCVD"), sputtering including reactive sputtering, electron-cyclotron-resonance plasma-enhanced chemical-vapor deposition (ECRPECVD"), inductively coupled plasma-enhanced chemical-vapor deposition ("ICPECVD"), or combinations thereof.

Figure 2:
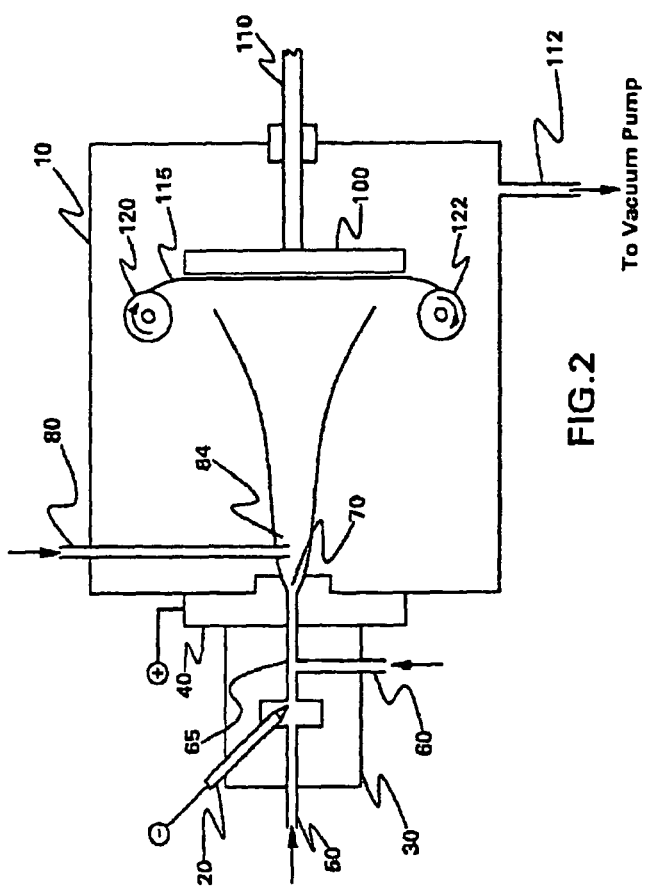
FIG. 2 is a schematic diagram of the apparatus of FIG. 1 used in a continuous deposition.

FIG. 1 schematically illustrates a reactor 10 and associated equipment for the ETPCVD technique. At least one cathode 20; typically made of tungsten, is disposed in a cathode housing 30. Anode plate 40 is disposed at one end of cathode housing 30. Optionally, at least a cathode housing is electrically floating. A voltage applied between cathode 20 and anode 40 generates an arc for plasma generation. A carrier gas, such as argon, is fed through line 50 to the arc. A plasma is generated and exits a nozzle or orifice 70 at the center of anode 40. A first reactant gas can be fed through line 60 into the carrier gas line at a point between cathode 20 and anode 40. A second reactant gas is fed through supply line 80 to a point downstream from orifice 70. Supply line 80 may also terminate with a perforated ring disposed within expanding plasma beam 84 for better mixing. Other reactant supply lines can be provided for different reactant species. Radicals are generated from reactant gases, combined, carried to substrate 90, and deposited thereon, which substrate is supported on substrate holder 100. Substrate holder 100 is disposed opposite and at a distance from nozzle 70 and is movable relative to nozzle 70 by substrate-holder shaft 110. Reactor 10 is kept under vacuum via vacuum connection 112. For example, when the coating on the substrate is desired to comprise silicon nitride, the first reactant gas can be ammonia, and the second reactant gas can be silane. The relative supply rates of first and second reactant gases are varied during deposition to vary the composition of the deposited material as the coating is built up. Although FIG. 1 schematically shows a substrate as a single piece 90, a coating may be deposited on a continuous substrate in similar equipment. For example, FIG. 2 shows a supply roll 120 of a thin polymeric substrate 115, which supply roll 120 is disposed on one side of substrate holder 100, and a take-up roll 122 disposed on the other side of substrate holder 100. As roll 120 continuously unwinds and roll 122 continuously winds, uncoated substrate film 115 continuously receives the coating material as it passes over substrate holder 100. In another embodiment of the invention, substrate film 115 passes through an area opposite to many overlapping plasma beams, each being generated with different or varying compositions to receive a coating, the composition of which varies continuously though its thickness.

In the ETPCVD technique, the plasma is generated at a high pressure compared to the regular PECVD technique. The plasma in arc channel 65 has a velocity on the order of sound velocity. The plasma expands supersonically into reactor chamber 10 via nozzle 70 and moves subsonically toward substrate 90.

Figure 3:
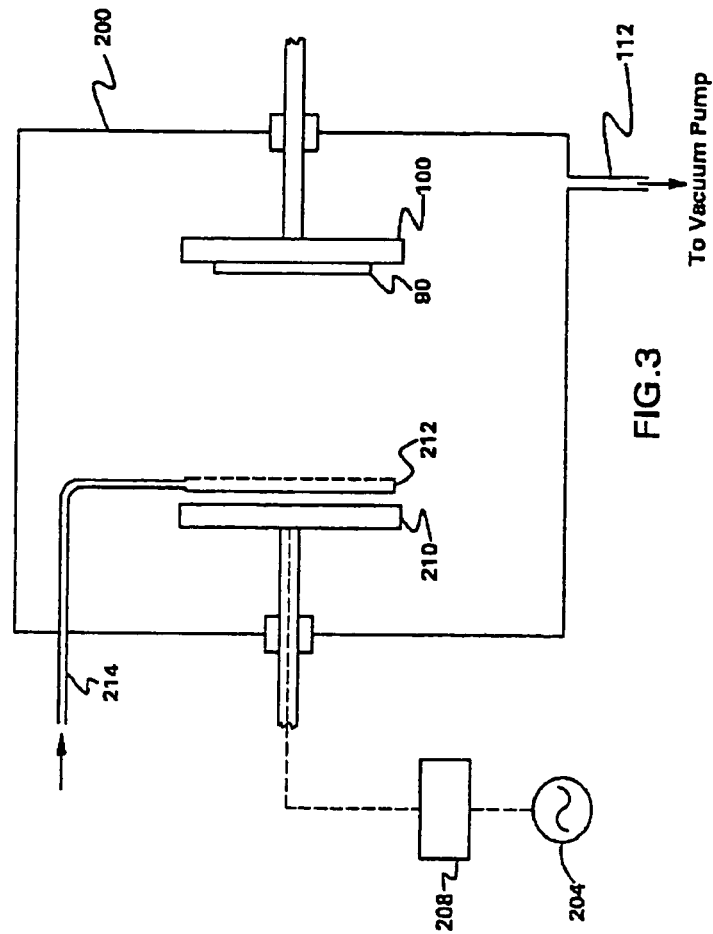
FIG. 3 is a schematic diagram of a deposition apparatus using the radio-frequency plasma-enhanced chemical-vapor deposition.

FIG. 3 schematically shows reactor 200 and associated equipment for the RFPECVD technique. Radio frequency ("RF") power is applied to cathode 210, which is disposed in reactor 200, by RF generator and amplifier 204 and matching network 208, which comprises a plurality of electrical and/or electronic components for generating appropriate impedance or other electrical characteristics of the overall system to maximize power transfer from RF generator and amplifier 204. Substrate 90 is disposed on substrate holder 100 opposite to cathode 210 to receive plasma deposition. Substrate holder may be grounded or electrically coupled to another RF generator and matching network, if a different potential is desired. A reactant gas or a mixture of gases is fed into a gas distributor 212 through a gas supply 214. Gas distributor 212 may have any shape that promotes a substantially uniform distribution of gases. For example, it may be a ring having perforations directed toward substrate holder 100. Alternatively, cathode 210 may itself be hollow and porous and receives reactant gases. A plasma is generated and maintained by the RF field and flows toward substrate 90. Precursor species in the plasma are combined and deposited on substrate 90. The composition of the coating can be varied while it is built up by varying the composition of the reactant gas mixture fed into distributor 212. A continuous substrate such as a polymeric film may be coated with a graded-composition coating by providing an unwinding supply roll and a take-up roll, as described above. The substrate likewise can travel opposite to a plurality of deposition stations, which supply varying gas compositions, to produce a continuous film having a graded-composition coating.

ECRPECVD is another suitable deposition technique. This method operates at low pressure, typically less than about 0.5 mm Hg, and typically without electrodes. A discharge is generated by microwave. A magnetic field is used to create the resonance condition of the electron gas, which results in a very high degree of ionization due to electron acceleration at a distance away from the substrate. The low pressure preserves a high number density of free radicals until the plasma reaches the substrate and prevents normally undesirable severe bombardment thereof.

ICPECVD is another electrodeless deposition technique that can create high-density plasma at low pressure. A plasma is generated by an electromagnetic field generated by a concentric induction coil disposed outside one end of the deposition chamber. The substrate is disposed in the deposition chamber at the opposite end. Deposition can typically be carried out at pressure much less than 0.5 mm Hg.

In another embodiment of the present invention, the energy of the ions in a plasma may be controlled such that they penetrate into a surface layer of the substrate to create a diffuse transition region between the composition of the bulk substrate and the composition of the coating. Such a transition prevents an abrupt change in the composition and mitigates any chance for delamination of the coating.

Figure 4:
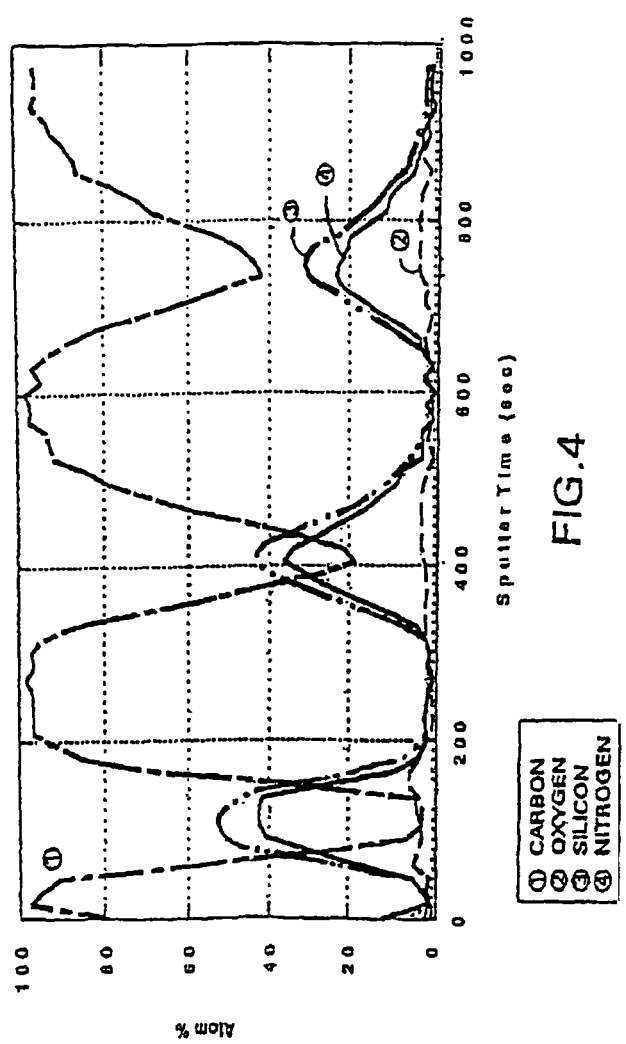
FIG. 4 shows the elemental composition at various depths of a graded-composition barrier coating of the present invention.
Figure 5:
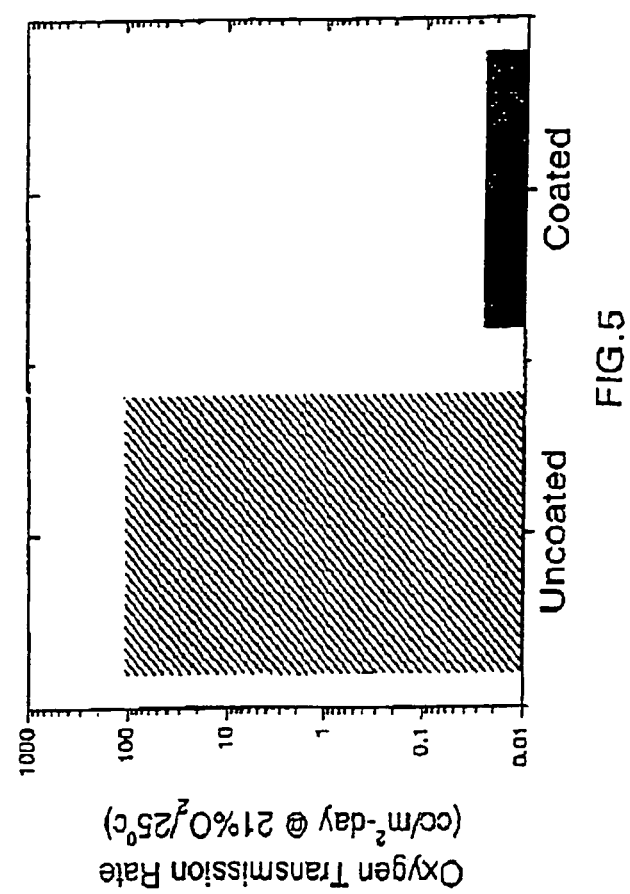
FIG. 5 compares the oxygen transmission rates through an uncoated substrate and one that is coated with a graded-composition barrier coating.
Figure 6:
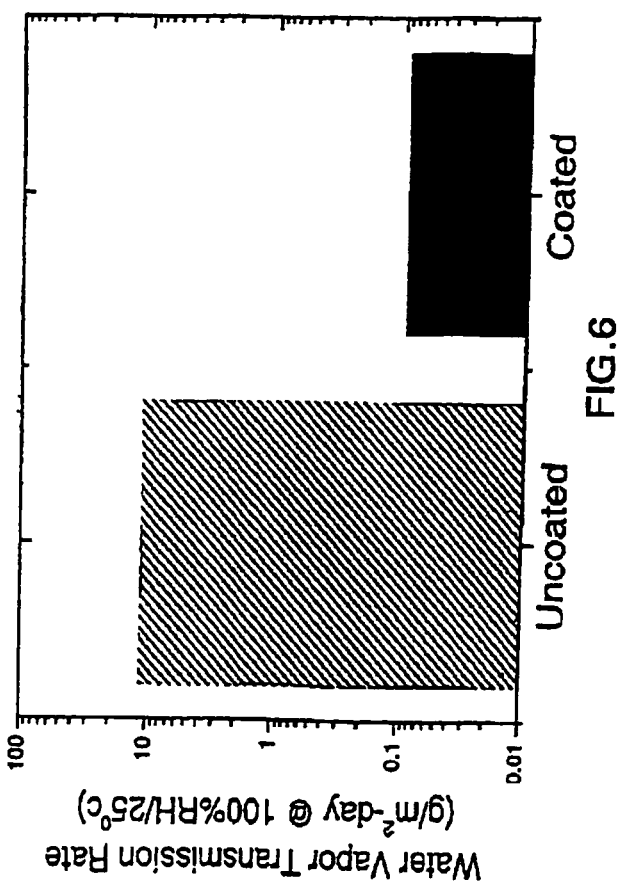
FIG. 6 compares the water transmission rates through an uncoated substrate and one that is coated with a graded-composition barrier coating.
Figure 7:
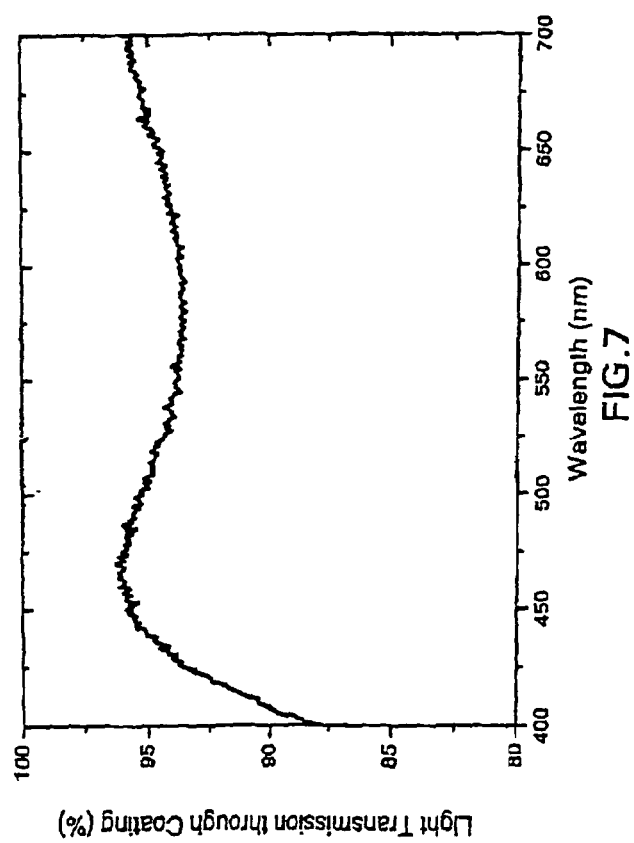
FIG. 7 shows the relative light transmission through a substrate having a graded-composition barrier coating compared to that through an uncoated substrate.

A graded-composition coating having a thickness of about 500 nm was formed on a polycarbonate substrate having a dimension of about 10 cm×10 cm and a thickness of about 0.2 mm using the RFPECVD technique and tested for water vapor and oxygen transmission. Silane (maximum flow rate of about 500 standard $cm^3$/minute), ammonia (maximum flow rate of about 60 standard $cm^3$/minute), and propylene oxide (maximum flow rate of about 500 standard $cm^3$/minute) were used to produce the graded coating comprising silicon, carbon, oxygen, and nitrogen. The rates of the reactant gases were varied during deposition so that the composition of the coating varied continuously across its thickness. The power fed to the RF electrode was about 100 W when plasma was generated from propylene oxide, and about 200 W when a mixture of silane and ammonia was fed into the reactor. The vacuum level in the reactor was about 0.2 mm Hg and the average temperature was about 55° C. FIG. 4 shows the elemental composition of the coating, as measured by dynamic XPS, as a function of sputtering time to remove portions of the thickness of the coating during the dynamic XPS testing, which is directly related to the depth of the coating. Oxygen and water vapor transmission test results are shown in FIGS. 5 and 6. The oxygen transmission rate through the coated plastic substrate was reduced by over three orders of magnitude compared to the uncoated substrate, and the water vapor transmission rate by over two orders of magnitude. Light transmission at various wavelengths of the visible spectrum through the coated substrate is shown in FIG. 7. The reduction in light transmission in the blue to red region (about 430 nm to about 700 nm) was generally less than 7 percent.

A plastic substrate coated with a graded-composition coating, which is formed by any method disclosed above can be advantageously used to produce flexible light sources based on organic light-emitting materials. Other electronic devices that can benefit from the protection afforded by a graded-composition coating are, for example, displays including liquid crystal displays, photovoltaic devices, flexible integrated circuits, or components of medical diagnostic systems. The term "flexible" means being capable of being bent into a shape having a radius of curvature of less than about 100 cm. The term "substantially transparent" means allowing a total transmission of at least about 50 percent, preferably at least about 80 percent, and more preferably at least 90 percent, of light in the visible range (i.e., having wavelength in the range from about 400 nm to about 700 nm). It should be understood that the composition of a graded-composition barrier coating does not necessarily vary monotonically from one surface to the other surface thereof. A monotonically varying composition is only one case of graded-composition for the barrier of the present invention.

Figure 8:
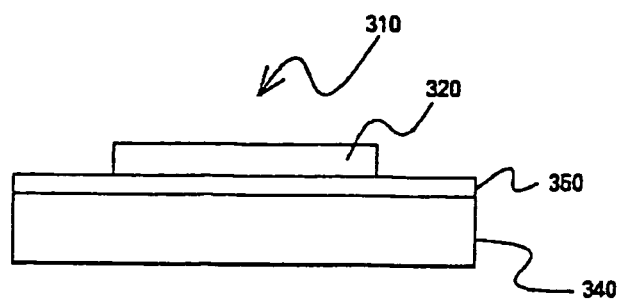
FIG. 8 shows schematically a device used with a substrate having a graded-composition barrier coating.

FIG. 8 is a schematic diagram of an embodiment of the present invention. It should be understood that the figures accompanying this disclosure are not drawn to scale. OELD or a light-emitting device 310 comprises an organic EL member 320 disposed on a substantially transparent substrate 340 having a graded-composition barrier coating 350, as described above. The graded-composition barrier coating 350 may be disposed or otherwise formed on either or both of the surfaces of the substrate 340 adjacent to the organic EL member 320. Preferably, the graded-composition barrier coating 350 is disposed or formed on the surface of the substrate 340 adjacent to the organic EL member 320 or it may completely cover the substrate 340. Although FIG. 8 shows schematically a distinct interface between substrate 340 and coating 350, such a coating may be formed such that there is no sharp interface therebetween, as described above.

Substrate 340 may be a single piece or a structure comprising a plurality of adjacent pieces of different materials and has an index of refraction (or refractive index) in the range from about 1.05 to about 2.5, preferably from about 1.1 to about 1.6. Preferably, substrate 340 is made of a substantially transparent polymeric material. Examples of suitable polymeric materials are polyethylenterephathalate ("PET"), polyacrylates, polycarbonate, silicone, epoxy resins, silicone-functionalized epoxy resins, polyester, polyimide, polyetherimide, PES, PEN, polynorbonenes, or poly (cyclic olefins).

Figure 9:
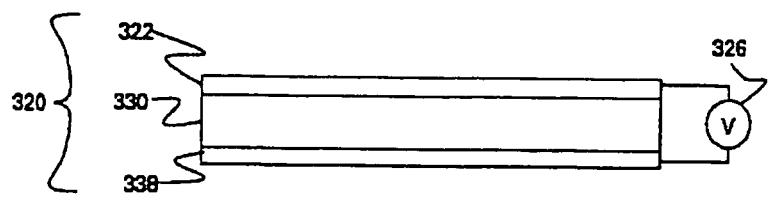
FIG. 9 shows schematically a construction of an OELD.

Light-emitting member 320 comprises at least one layer 330 of at least one organic EL material sandwiched between two electrodes 322 and 338, as shown in FIG. 9. As will be disclosed below, the light-emitting member may comprise one or more additional layers between an electrode and the layer 330 of organic EL material. When a voltage is supplied by a voltage source 326 and applied across electrodes 322 and 338, light emits from the organic EL material. In a preferred embodiment, electrode 322 is a cathode injecting negative charge carriers (electrons) into organic EL layer 330 and is made of a material having a low work function; e.g., less than about 4 eV. Low-work function materials suitable for use as a cathode are K, Li, Na, Mg, La, Ce, Ca, Sr, Ba, Al, Ag, In, Sn, Zn, Zr, Sm, Eu, alloys thereof, or mixtures thereof. Preferred materials for the manufacture of cathode layer 322 are Ag—Mg, Al—Li, In—Mg, and Al—Ca alloys. Layered non-alloy structures are also possible, such as a thin layer of a metal such as Ca (thickness from about 1 to about 10 nm) or a non-metal such as LiF, covered by a thicker layer of some other metal, such as aluminum or silver. In this embodiment, electrode 338 is an anode injecting positive charge carriers (or holes) into organic layer 330 and is made of a material having a high work function; e.g., greater than about 4.5 eV, preferably from about 5 eV to about 5.5 eV. Indium tin oxide ("ITO") is typically used for this purpose. ITO is substantially transparent to light transmission and allows at least 80% light transmitted therethrough. Therefore, light emitted from organic electroluminescent layer 330 can easily escape through the ITO anode layer without being seriously attenuated. Other materials suitable for use as the anode layer are tin oxide, indium oxide, zinc oxide, indium zinc oxide, cadmium tin oxide, and mixtures thereof. In addition, materials used for the anode may be doped with aluminum or fluorine to improve charge injection property. Electrode layers 322 and 338 may be deposited on the underlying element by physical vapor deposition, chemical vapor deposition, ion beam-assisted deposition, or sputtering. A thin, substantially transparent layer of a metal is also suitable.

Although the preferred order of the cathode and anode layers 322 and 338 is disclosed above, the electrode layers may be reversed. Electrode layers 322 and 338 may serve as the anode and cathode, respectively. Typically, the thickness of the cathode layer in this case is about 200 nm.

Organic EL layer 330 serves as the transport medium for both holes and electrons. In this layer these excited species combine and drop to a lower energy level, concurrently emitting EM radiation in the visible range. Organic EL materials are chosen to electroluminesce in the desired wavelength range. The thickness of the organic EL layer 330 is preferably kept in the range of about 100 to about 300 nm. The organic EL material may be a polymer, a copolymer, a mixture of polymers, or lower molecular-weight organic molecules having unsaturated bonds. Such materials possess a delocalized $\pi$-electron system, which gives the polymer chains or organic molecules the ability to support positive and negative charge carriers with high mobility. Suitable EL polymers are poly (N-vinylcarbazole) ("PVK", emitting violet-to-blue light in the wavelengths of about 380-500 nm); poly(alkylfluorene) such as poly (9,9-dihexylfluorene) (410-550 nm), poly(dioctylfluorene) (wavelength at peak EL emission of 436 nm), or poly{9,9-bis(3,6-dioxaheptyl)-fluorene-2,7-diyl} (400-550 nm); poly(praraphenylene) derivatives such as poly(2-decyloxy-1,4-phenylene) (400-550 nm). Mixtures of these polymers or copolymers based on one or more of these polymers and others may be used to tune the color of emitted light.

Another class of suitable EL polymers is the polysilanes. Polysilanes are linear silicon-backbone polymers substituted with a variety of alkyl and/or aryl side groups. They are quasi one-dimensional materials with delocalized $\sigma$-conjugated electrons along polymer backbone chains. Examples of polysilanes are poly(di-n-butylsilane), poly(di-n-pentylsilane), poly(di-n-hexylsilane), poly(methylphenylsilane), and poly{bis(p-butylphenyl)silane} which are disclosed in H. Suzuki et al., "Near-Ultraviolet Electroluminescence From Polysilanes," 331 Thin Solid Films 64-70 (1998). These polysilanes emit light having wavelengths in the range from about 320 nm to about 420 nm.

Organic materials having molecular weight less than about 5000 that are made of a large number of aromatic units are also applicable. An example of such materials is 1,3,5-tris{n-(4-diphenylaminophenyl) phenylamino}benzene, which emits light in the wavelength range of 380-500 nm. The organic EL layer also may be prepared from lower molecular weight organic molecules, such as phenylanthracene, tetraarylethene, coumarin, rubrene, tetraphenylbutadiene, anthracene, perylene, coronene, or their derivatives. These materials generally emit light having maximum wavelength of about 520 nm. Still other suitable materials are the low molecular-weight metal organic complexes such as aluminum-, gallium-, and indium-acetylacetonate, which emit light in the wavelength range of 415-457 nm, aluminum-(picolymethylketone)-bis {2,6-di(t-butyl)phenoxide} or scandium-(4-methoxy-picolylmethylketone)-bis(acetylacetonate), which emits in the range of 420-433 nm. For white light application, the preferred organic EL materials are those emit light in the blue-green wavelengths.

More than one organic EL layer may be formed successively one on top of another, each layer comprising a different organic EL material that emits in a different wavelength range. Such a construction can facilitate a tuning of the color of the light emitted from the overall light-emitting device 310.

Figure 10:
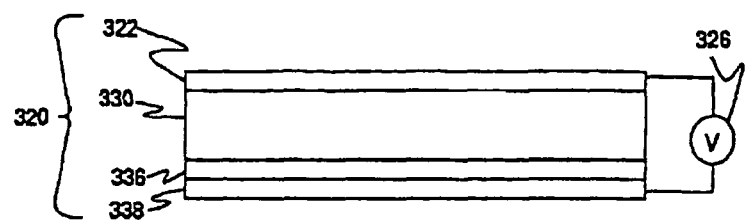
FIG. 10 shows another embodiment of an OELD including a hole injection enhancement layer.

Furthermore, one or more additional layers may be included in light-emitting member 320 to increase the efficiency of the overall device 310. For example, these additional layers can serve to improve the injection (electron or hole injection enhancement layers) or transport (electron or hole transport layers) of charges into the organic EL layer. The thickness of each of these layers is kept to below 500 nm, preferably below 100 nm. Materials for these additional layers are typically low-to-intermediate molecular weight (less than about 2000) organic molecules. They may be applied during the manufacture of the device 310 by conventional methods such as spray coating, dip coating, or physical or chemical vapor deposition. In one embodiment of the present invention, as shown in FIG. 10, a hole injection enhancement layer 336 is formed between the anode layer 338 and the organic EL layer 330 to provide a higher injected current at a given forward bias and/or a higher maximum current before the failure of the device. Thus, the hole injection enhancement layer facilitates the injection of holes from the anode. Suitable materials for the hole injection enhancement layer are arylene-based compounds disclosed in U.S. Pat. No. 5,998,803; such as 3,4,9,10-perylenetetra-carboxylic dianhydride or bis(1,2,5-thiadiazolo)-p-quinobis(1,3-dithiole).

Figure 11:
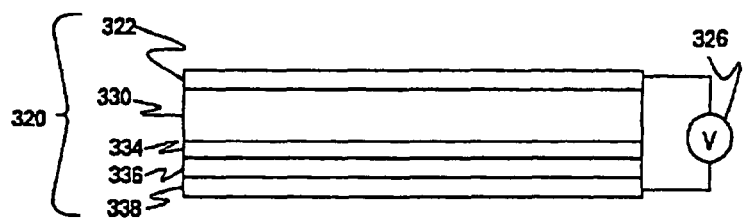
FIG. 11 shows another embodiment of an OELD including a hole injection enhancement layer and a hole transport layer.

In another embodiment of the present invention, as shown in FIG. 11, light-emitting member 320 further includes a hole transport layer 334 which is disposed between the hole injection enhancement layer 336 and the organic EL layer 330. The hole transport layer 334 has the functions of transporting holes and blocking the transportation of electrons so that holes and electrons are optimally combined in the organic EL layer 330. Materials suitable for the hole transport layer are triaryldiamine, tetraphenyldiamine, aromatic tertiary amines, hydrazone derivatives, carbazole derivatives, triazole derivatives, imidazole derivatives, oxadiazole derivatives having an amino group, and polythiophenes as disclosed in U.S. Pat. No. 6,023,371, which is incorporated herein by reference.

Figure 12:
FIG. 12 shows another embodiment of an OELD including an electron injecting and transporting layer.

In still another embodiment of the present invention, as shown schematically in FIG. 12, light-emitting member 320 includes an additional layer 324 which is disposed between the cathode layer 322 and the organic EL layer 330. Layer 324 has the combined function of injecting and transporting electrons to the organic EL layer 330. Materials suitable for the electron injecting and transporting layer are metal organic complexes such as tris(8-quinolinolato)aluminum, oxadiazole derivatives, perylene derivatives, pyridine derivatives, pyrimidine derivatives, quinoline derivatives; quinoxaline derivatives, diphenylquinone derivatives, and nitro-substituted fluorene derivatives, as disclosed in U.S. Pat. No. 6,023,371, which is incorporated herein by reference.

A reflective metal layer 360 may be disposed on organic EL member 320 to reflect any radiation emitted away from the substantially transparent substrate 340 and direct such radiation toward the substrate 340 such that the total amount of radiation emitted in this direction is increased. Reflective metal layer 360 also serves an additional function of preventing diffusion of reactive environmental elements, such as oxygen and water vapor, into the organic EL element 320. Such a diffusion otherwise can degrade the long-term performance of the OELD. Suitable metals for the reflective layer 360 are silver, aluminum, and alloys thereof. It may be advantageous to provide a thickness that is sufficient to substantially prevent the diffusion of oxygen and water vapor, as long as the thickness does not substantially reduce the flexibility of the entire device. In one embodiment of the present invention, one or more additional layers of at least a different material, such as a different metal or metal compound, may be formed on the reflective layer to further reduce the rate of diffusion of oxygen and water vapor into the organic EL member. In this case, the material for such additional layer or layers need not be a reflective material. Compounds, such as metal oxides, nitrides, carbides, oxynitrides, or oxycarbides, may be useful for this purpose.

Figure 13:
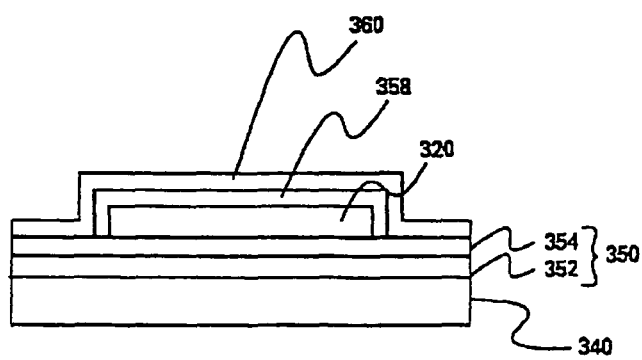
FIG. 13 shows an OELD sealed between a substrate having a graded-composition barrier coating and a reflective layer.

In another embodiment of the present invention, as shown in FIG. 13, a bonding layer 358 of a substantially transparent organic polymeric material may be disposed on the organic EL member 320 before the reflective metal layer 360 is deposited thereon. Examples of materials suitable for forming the organic polymeric layer are polyacrylates such as polymers or copolymers of acrylic acid, methacrylic acid, esters of these acids, or acylonitrile; poly(vinyl fluoride); poly(vinylidene chloride); poly(vinyl alcohol); copolymer of vinyl alcohol and glyoxal (also known as ethanedial or oxaaldehyde); polyethyleneterephthalate, parylene (thermoplastic polymer based on p-xylene), and polymers derived from cycloolefins and their derivatives (such as poly (arylcyclobutene) disclosed in U.S. Pat. Nos. 4,540,763 and 5,185,391 which are incorporated herein by reference). Preferably, the bonding layer material is an electrically insulating and substantially transparent polymeric material. A suitable material is polyacrylates.

Figure 14:
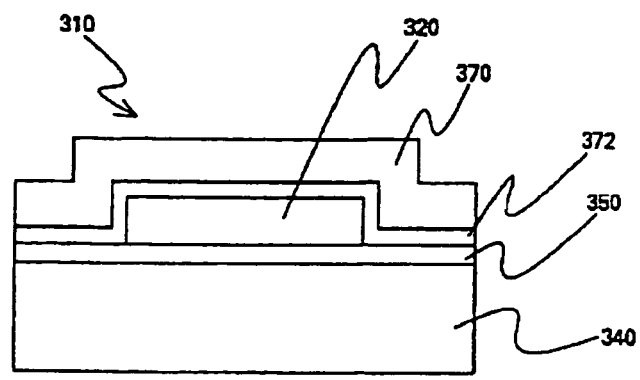
FIG. 14 shows an OELD sealed between two substrates, each having a graded-composition barrier coating.

In another embodiment of the present invention, as shown in FIG. 14, a second polymeric substrate 370 having a graded-composition barrier coating 372 is disposed on organic EL member 320 opposite to substrate 340 to form a complete seal around organic EL member 320. Graded-composition barrier coating 372 may be disposed on either side of substrate 370. It may be preferred to dispose graded-composition barrier coating 372 adjacent to organic EL member 320. Second polymeric substrate 370 having graded-composition barrier coating 372 may also be disposed on reflective metal layer 360 to provide even more protection to organic EL member 320. Alternatively, graded-composition barrier 372 may be deposited directly on organic EL member 320 instead of being disposed on a second polymeric substrate (such as 370). In this case, the second substrate (such as 370) may be eliminated.

Alternatively, second substrate 370 having graded-composition barrier coating 372 can be disposed between organic EL member 320 and reflector layer 360. This configuration may be desirable when it can offer some manufacturing or cost advantage, especially when the transparency of coated substrate 370 is also substantial.

Figure 15:
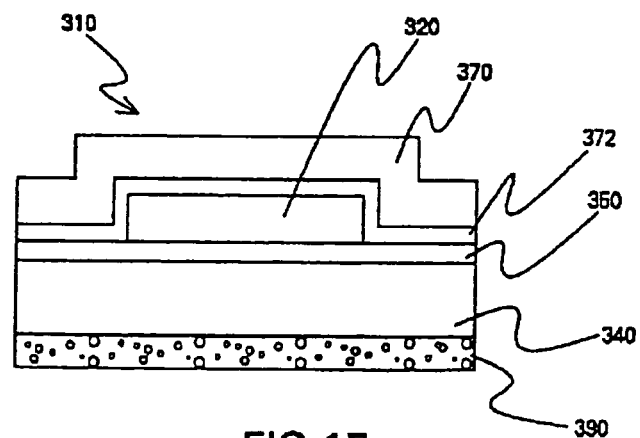
FIG. 15 shows a sealed OELD having a light conversion layer.

In another embodiment of the present invention, the light-emitting device 310 further comprises a light-scattering material disposed in the path of light emitted from the light-emitting device 310 to provide more uniform light therefrom. For example, FIG. 15 illustrates an embodiment comprising a layer 390 of scattering material disposed on the substrate 340. The light-scattering material is provided by choosing particles that range in size from about 10 nm to about 100 micrometers. A preferred embodiment includes particles about 4 micrometers in size. For example, for a device emitting white light, the particle size is preferably on the order of 50-65 nm. Particles of the light-scattering material may be advantageously dispersed in a substantially transparent polymeric film-forming material such as those disclosed above, and the mixture is formed into a film which may be disposed on the substrate 340. Suitable light-scattering materials are solids having refractive index higher than that of the film forming material. Since typical film forming materials have refractive indices between about 1.3 to about 1.6, the particulate scattering material should have a refractive index higher than about 1.6 and should be optically transparent over the target wavelength range. In addition, it is preferable that the light scattering material be non-toxic and substantially resistant to degradation upon exposure to normal ambient environments. For a device designed to provide visible illumination (wavelength in the range of about 400-700 nm), examples of suitable light-scattering materials are rutile ($TiO_2$), hafnia ($HfO_2$), zirconia ($ZrO_2$), zircon ($ZrO_2.SiO_2$), gadolinium gallium garnet ($Gd_3Ga_5O_{12}$), barium sulfate, yttria ($Y_2O_3$), yttrium aluminum garnet ("YAG", $Y_3Al_5O_{12}$) calcite ($CaCO_3$), sapphire ($Al_2O_3$), diamond, magnesium oxide, germanium oxide. It is necessary to prepare these compounds with a high degree of optical purity; i.e. impurities that absorb light in the wavelength range of interest must be rigorously minimized. It is not necessary that the compound be stoichiometrically pure, phase pure, and may contain appropriate atomic substitutions; e.g., Gd may be substituted for up to 60% of the yttrium in YAG. Particles composed of high-refractive index glasses, such as may be obtained from Schott Glass Technologies or Corning, Inc. may also be used, provided that they are impervious to darkening from exposure to light emitted by the OELD and its phosphors. Scattering of light may also be achieved with a plastic or glass film having a roughened or textured surface (a "diffuser film", the roughened features of which are typically on the order of a fraction of the wavelength of the scattered light. In one embodiment of the present invention, one surface of the substrate can be textured or roughened to promote light scattering.

According another aspect of the present invention, the light-scattering particles in layer 390 can comprise a photoluminescent ("PL") material (or also herein called a "phosphor"), which is capable of absorbing a portion of the EM radiation emitted by the organic EL member having a first wavelength range and emitting EM radiation having a second wavelength range. Thus, inclusion of such a PL material can provide a tuning of color of light emitted from the OELD. The particle size and the interaction between the surface of the particle and the polymeric medium determine how well particles are dispersed in polymeric materials to form the film or layer 390. Many micrometer-sized particles of oxide materials, such as zirconia, yttrium and rare-earth garnets, and halophosphates, disperse well in standard silicone polymers, such as poly(dimethylsiloxanes) by simple stirring. If necessary, other dispersant materials (such as a surfactant or a polymeric material like poly(vinyl alcohol)) may be added such as are used to suspend many standard phosphors in solution. The phosphor particles may be prepared from larger pieces of phosphor material by any grinding or pulverization method, such as ball milling using zirconia-toughened balls or jet milling. They also may be prepared by crystal growth from solution, and their size may be controlled by terminating the crystal growth at an appropriate time. The preferred phosphor materials efficiently absorb EM radiation emitted by the organic EL material and re-emit light in another spectral region. Such a combination of the organic EL material and the phosphor allows for a flexibility in tuning the color of light emitted by the light-emitting device 310. A particular phosphor material or a mixture of phosphors may be chosen to emit a desired color or a range of color to complement the color emitted by the organic EL material and that emitted by the organic PL materials. An exemplary phosphor is the cerium-doped yttrium aluminum oxide $Y_3Al_5O_{12}$ garnet ("YAG:Ce"). Other suitable phosphors are based on YAG doped with more than one type of rare earth ions, such as $(Y_{1-x-y}Gd_xCe_y)_3Al_5O_{12}$ ("YAG:Gd,Ce"), $(Y_{1-x}Ce_x)_3$ $(Al_{1-y}Ga_y)O_{12}$ ("YAG:Ga,Ce"), $(Y_{1-x-y}Gd_xCe_y)(Al_{5-z}Ga_z)O_{12}$ ("YAG:Gd,Ga,Ce"), and $(Gd_{1-x}Ce_x)Sc_2Al_3O_{12}$ ("GSAG") where $0 \leq x \leq 1$, $0 \leq y \leq 1$, $0 \leq z \leq 5$ and $x+y \leq 1$. For example, the YAG:Gd,Ce phosphor shows an absorption of light in the wavelength range from about 390 nm to about 530 nm (i.e., the blue-green spectral region) and an emission of light in the wavelength range from about 490 nm to about 700 nm (i.e., the green-to-red spectral region). Related phosphors include $Lu_3Al_5O_{12}$ and $Tb_2Al_5O_{12}$, both doped with cerium. In addition, these cerium-doped garnet phosphors may also be additionally doped with small amounts of Pr (such as about 0.1-2 mole percent) to produce an additional enhancement of red emission. The following are examples of phosphors that are efficiently excited by EM radiation emitted in the wavelength region of 300 nm to about 500 nm by polysilanes and their derivatives.

Green-emitting phosphors: $Ca_8Mg(SiO_4)_4Cl_2:Eu^{2+}$, $Mn^{2+}$; $GdBO_3:Ce^{3+}$, $Tb^{3+}$; $CeMgAl_{11}O_{19}:Tb^{3+}$; $Y_2SiO_5:Ce^{3+}$, $Tb^{3+}$; and $BaMg_2Al_{16}O_{2-}:Eu^{2+}$, $Mn^{2+}$.

Red-emitting phosphors: $Y_2O_3:Bi^{3+}$, $Eu^{3+}$; $Sr_2P_2O_7:Eu^{2+}$, $Mn^{2+}$; $SrMgP_2O_7:Eu^{2+}$, $Mn^{2+}$; $(Y,Gd)(V,B)O_4:Eu^{3+}$; and $3.5 MgO.0.5MgF_2.GeO_2:Mn^{4+}$ (magnesium fluorogermanate).

Blue-emitting phosphors: $BaMg_2Al_{16}O_{27}:Eu^{2+}$; $Sr_5(PO_4)_{10}Cl_2:Eu^{2+}$; and $(Ba,Ca,Sr)_5(PO_4)_{10}(Cl,F)_2:Eu^{2+}$, $(Ca,Ba,Sr)(Al,Ga)_2S_4:Eu^{2+}$.

Yellow-emitting phosphors: $(Ba,Ca,Sr)_5(PO_4)_{10}(Cl,F)_2$: $Eu^{2+}$, $Mn^{2+}$.

Still other ions may be incorporated into the phosphor to transfer energy from the light emitted from the organic material to other activator ions in the phosphor host lattice as a way to increase the energy utilization. For example, when $Sb^{3+}$ and $Mn^{2+}$ ions exist in the same phosphor lattice, $Sb^{3+}$ efficiently absorbs light in the blue phosphors not absorbed very efficiently by $Mn^{2+}$, and transfers the energy to $Mn^{2+}$ ion. Thus, a larger total amount of light emitted by the organic EL material is absorbed by both ions, resulting in higher quantum efficiency of the total device.

The photoluminescent material may also be an organic dye that can absorb radiation emitted by the organic EL material and emit electromagnetic radiation in the visible spectrum.

The phosphor particles are dispersed in a film-forming polymeric material, such as polyacrylates, substantially transparent silicone or epoxy. A phosphor composition of less than about 30, preferably less than about 10, percent by volume of the mixture of polymeric material and phosphor is used. A solvent may be added into the mixture to adjust the viscosity of the film-forming material to a desired level. The mixture of the film-forming material and phosphor particles is formed into a layer by spray coating, dip coating, printing, or casting on a substrate. Thereafter, the film is removed from the substrate and disposed on the light-emitting member 320. The thickness of film or layer 390 is preferably less than 1 mm, more preferably less than 500 μm. Preferably, the film-forming polymeric materials have refractive indices close to those of the substrate 340 and the organic EL material; i.e., in the range from about 1.4 to about 1.6.

According to one aspect of the present invention, particles of a scattering material and a phosphor are dispersed in the same film or layer 390. In another embodiment, scattering film 390 may be a diffuser film, which is a plastic film having a roughened surface.

A method of making an OELD of the present invention is now described. A cleaned flexible substrate, such as a plastic, is first provided. Then, a graded-composition barrier coating is formed on at least a surface of the flexible substrate by a one of many deposition techniques disclosed above.

A first electrically conducting material is deposited on the graded-composition barrier coating to form a first electrode of the organic EL member 320. Alternatively, the first electrode may be deposited on the surface of the substrate 340 that has not been coated with graded-composition barrier coating. The first electrode may be an anode or a cathode, and one or more appropriate materials are chosen among those disclosed earlier for the electrodes. Preferably, the first electrode is an anode comprising a transparent metal oxide, such as ITO. The first electrode material preferably sputter-deposited on the substrate. Furthermore, the first electrode may be patterned to a desired configuration by, for example, etching. At least one organic EL material is deposited on the first electrode by physical or chemical vapor deposition, spin coating, dip coating, spraying, printing, or casting, followed by polymerization, if necessary, or curing of the material. The organic EL material may be diluted in a solvent to adjust its viscosity or mixed with another polymeric material that serves as a film-forming vehicle. A second electrically conducting material is deposited on the at least one organic EL material to form a second electrode. Preferably, the second electrode is a cathode. The second electrode may be deposited on the entire area of the organic EL material or patterned into a desired shape or configuration. The thickness of the second electrode is kept to a minimum, such as less than or equal to about 200 nm. The electrodes and the organic EL material comprise the organic EL member 320.

A reflective metal is optionally deposited on the surface of the organic EL member 320 opposite to substrate 340. The reflective metal may be deposited by, for example, sputtering or physical vapor deposition. In one embodiment of the present invention, a bonding layer of a substantially transparent material is deposited on the organic EL member 320 before the layer of reflective metal is deposited thereon. Preferably, the bonding layer comprises an electrically insulating and substantially transparent polymeric material. The bonding layer may be deposited by one of the methods disclosed above for deposition of an organic layer. The reflective metal layer is formed so as to completely surround the organic EL member 320. Preferably, the reflective metal layer together with the graded-composition barrier coating forms a hermetic seal around the organic EL member 20. Furthermore, one or more additional layers of other inorganic materials may be deposited on the reflective metal layer.

A mixture of particles of a scattering or PL material and a transparent polymeric material is deposited on the surface of the substrate 340 opposite the organic EL member. Alternatively the mixture may be cast into a tape by a tape casting method, such as the doctor blade method. The tape is then cured and attached to the substrate 340.

In another embodiment, subsets of layers necessary or desired for the operation of an OELD of the present invention are formed in separate assemblies, and the assemblies are laminated or attached together to produce a working device. For example, a first substrate having a first graded-composition barrier coating, an assembly of an organic EL member, and a second substrate having a second graded-composition barrier coating are laminated together to provide a light source having improved resistance to attack by chemical species in the environment.

In still another aspect of the present invention, large-area flexible displays or lighting systems incorporate OELDs of the present invention.

While specific preferred embodiments of the present invention have been disclosed in the foregoing, it will be appreciated by those skilled in the art that many modifications, substitutions, or variations may be made thereto without departing from the spirit and scope of the invention as defined in the appended claims.

The invention claimed is:

1. A method for making a composite article, said method comprising:
   providing a substrate having at least a substrate surface;
   depositing a coating material comprising an inorganic and an organic material, said coating material having a composition on said substrate surface; and
   changing said composition of said coating material substantially continuously while said coating is being formed such that said composition varies substantially continuously across a thickness of said coating;
   wherein the composition of said coating material varies across a thickness thereof such that a graph of the percent composition of one of the components of the coating versus the depth of the coating has plural peaks.

2. The method according to claim 1, wherein said depositing is selected from the group consisting of plasma-enhanced chemical-vapor deposition, radio-frequency plasma-enhanced chemical-vapor deposition, expanding thermal-plasma chemical-vapor deposition, sputtering, reactive sputtering, electron-cyclotron-resonance plasma-enhanced chemical-vapor deposition, inductively-coupled plasma-enhanced chemical-vapor deposition, and combinations thereof.

3. The method according to claim 1, wherein said substrate comprises a polymeric material selected from the group consisting of polyethyleneterephthalate, polyacrylates, polycarbonate, silicone, epoxy resins, silicone-functionalized epoxy resins, polyester, polyimide, polyetherimide, polyethersulfone, polyethylenenapthalene, polynorbonene, poly(cyclic olefins).

4. The method according to claim 1, wherein said coating material further comprises material selected from the group consisting of organic, inorganic, ceramic materials, and combinations thereof.

5. The method according to claim 4, wherein said inorganic and ceramic materials are selected from the group consisting of oxide, nitride, carbide, boride, and combinations thereof of elements of Groups IIA, IIIA, IVA, VA, VIA, VIIA, IB, and IIB, metals of Groups IIIB, IVB, and VB, and rare-earth metals.

6. The method according to claim 1 further comprising effecting a penetration of at least a portion of said coating material into said substrate to produce a diffuse region between said substrate and said coating.

7. The method according to claim 6, wherein said diffuse region is produced by an energetic ion bombardment of a surface of said substrate to sputter a portion of a material of said substrate, and depositing a mixed material comprising sputtered substrate material and another material.

8. The method according to claim 1, wherein said changing said composition of said coating is carried out by changing a composition of reactive species generated by a plasma that is directed at said substrate.

9. The method according to claim 1 wherein said plural peaks are substantially the same height.

10. The method according to claim 1 wherein the plurality of peaks is at least three.

11. The method according to claim 10 wherein the height of the peaks changes as a function of depth.

* * * * *